(12) United States Patent
Song et al.

(10) Patent No.: US 7,962,234 B2
(45) Date of Patent: Jun. 14, 2011

(54) MULTIDIMENSIONAL PROCESS WINDOW OPTIMIZATION IN SEMICONDUCTOR MANUFACTURING

(75) Inventors: Yunsheng Song, Poughkeepsie, NY (US); Xu Ouyang, Hopewell Junction, NY (US); James P. Rice, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 12/135,522

(22) Filed: Jun. 9, 2008

(65) Prior Publication Data

US 2009/0306807 A1  Dec. 10, 2009

(51) Int. Cl.
  *G06F 19/00* (2006.01)
(52) U.S. Cl. .......... 700/108; 700/95; 700/110; 700/121
(58) Field of Classification Search .................. 700/95, 700/108, 110, 121, 51–52, 91, 106, 109
See application file for complete search history.

(56) References Cited

U.S. PATENT DOCUMENTS

| | | | |
|---|---|---|---|
| 5,943,550 A * | 8/1999 | Fulford et al. ................ 438/14 |
| 6,544,429 B1 * | 4/2003 | Hung et al. ................... 216/67 |
| 7,333,871 B2 * | 2/2008 | Schwarm ...................... 700/108 |
| 7,386,420 B2 * | 6/2008 | Zhang et al. ................. 702/179 |
| 7,502,709 B2 * | 3/2009 | Funk et al. .................... 702/127 |
| 7,694,244 B2 * | 4/2010 | Chan et al. .................... 716/132 |
| 2002/0123818 A1 * | 9/2002 | Yamada et al. ............... 700/121 |
| 2003/0097228 A1 * | 5/2003 | Satya et al. .................... 702/82 |
| 2005/0010319 A1 * | 1/2005 | Patel et al. .................... 700/121 |
| 2005/0252884 A1 * | 11/2005 | Lam et al. ....................... 216/59 |
| 2007/0142957 A1 * | 6/2007 | Miwa et al. ................... 700/121 |
| 2008/0294281 A1 * | 11/2008 | Shimshi et al. ............... 700/110 |
| 2008/0304057 A1 * | 12/2008 | Bills et al. ................... 356/237.5 |
| 2009/0292385 A1 * | 11/2009 | Flach et al. .................... 700/108 |

OTHER PUBLICATIONS

Umetrics AB, User's guide to SIMCA-P version 11), May 2005, pp. 133-193, 279, 303, 315 http://www.umetrics.com/Content/Document%20Library/Files/UserGuides-Tutorials/SIMCA-P_11_UG.pdf.*

* cited by examiner

*Primary Examiner* — Albert Decady
*Assistant Examiner* — Olvin Lopez
(74) *Attorney, Agent, or Firm* — Ian D. MacKinnon

(57) ABSTRACT

A method for optimizing multiple process windows in a semiconductor manufacturing process is disclosed. The method comprises performing dependent variable composition on a plurality of dependent variables. Metrology data is joined with the dependent variables, and then a partial least squares regression is performed on the joined data set to obtain a prediction equation, and a variable importance prediction for each process window in a process window set. A set of product limited yield are derived, and the process window, set is adjusted, and the yields recalculated, until an optimal process window set is derived.

11 Claims, 8 Drawing Sheets

MULTIDIMENSIONAL PROCESS WINDOW OPTIMIZATION IN SEMICONDUCTOR MANUFACTURING

FIELD OF THE INVENTION

This invention relates generally to semiconductor device fabrication, and more particularly to techniques for optimizing process windows used during the fabrication process.

BACKGROUND OF THE INVENTION

In semiconductor design, particularly SRAM design, it is often desirable to create a contact bridge between contacts in very close proximity. In particular, contact areas (CAs) are connected together to form complex circuits from basic transistors. For example, the gate of one transistor may be connected to the drain or source of another transistor.

Modern semiconductor devices typically have multiple levels of metal interconnects. The metal interconnects are typically formed via a deposition and patterning sequence as is known in the art. During the process of forming interconnects, defects, such as CA opens and CA shorts decrease the overall production yield. Various parameters affect the probabilities of CA opens and CA shorts. Moving a process window in one direction may reduce the number of CA opens, but increase the number of CA shorts. There is an inherent tradeoff in semiconductor manufacturing between the number of CA shorts and the number of CA opens.

In current semiconductor fabrication techniques, a process window is optimized for only one parameter at a time, and the tradeoff between CA opens and CA shorts is not well accounted for. For example, if a CD (critical dimension) process window is optimized, this will require a shift in the oxide thickness process window. However, if the oxide thickness process window is to be optimized, the CD process window will then shift. This can adversely affect the overall production yield. Therefore, what is desired is a technique for improved process window optimization, which will in turn improve overall production yields in semiconductor manufacturing.

SUMMARY OF THE INVENTION

The present invention provides a method for optimizing multiple process windows, each process window corresponding to a different parameter, in a semiconductor manufacturing process, comprising the steps of:
performing dependent variable composition on a plurality of dependent variables;
retrieving metrology data for each process parameter;
joining the plurality of dependent variables and the metrology data to form a joined data set;
performing a partial least squares regression on the joined data set to obtain a prediction equation, and a variable importance prediction for each process parameter;
generating a process target value for each parameter, based on the value of the corresponding variable importance prediction;
generating a new process window for each parameter, based on the corresponding process target value, thereby forming a process window set; and
evaluating the process window set by deriving a plurality of product limited yield values based on data corresponding to the process window set, and comparing it to the plurality of product limited yield values derived with a previous process window set, and computing a predicted product yield value based on the product of the plurality of product limited yield values; whereby the steps of generating a process target value for each parameter, based on the value of the corresponding variable importance prediction and generating a new process target window for each parameter, based on the corresponding process target value are repeated until the predicted product yield value has reached an optimal value, thereby deriving an optimized process window set.

Additionally, the present invention provides a method that further comprises the step of generating a report displaying the process target value corresponding to each process window of the optimized process window set.

Additionally, the present invention provides a method that further comprises the step of generating a report displaying the process lower specification limit, and upper specification limit corresponding to each process window of the optimized process window set.

Additionally, the present invention provides a method that further comprises the step of inputting the optimized process window set to one or more process tools.

Additionally, the present invention provides a method in which the step of evaluating the process window set by deriving a plurality of product limited yield values comprises deriving a CA open product limited yield, and deriving a CA short product limited yield.

Additionally, the present invention provides a method in which the plurality of dependent variables are selected from the group consisting of:
oxide thickness before contact lithography;
contact size after lithographic development; contact etch bias; and
contact-to-polysilicon alignment.

Additionally, the present invention provides a method in which the step of performing dependent variable composition comprises the steps of:
measuring a test structure yield for each dependent variable on a plurality of semiconductor devices;
calculating a lambda value based on the measured test structure yield;
deriving a product limited yield for each dependent variable based on the lambda value;
multiplying each product limited yield together to derive a predicted product yield.

Additionally, the present invention provides a method that further comprises the steps of: generating a plurality of bucket indices, wherein each bucket index corresponds to a process window, and each process window overlaps with the process window of at least one adjacent bucket index; and
in which the step evaluating the process window set by deriving a process yield value based on data corresponding to the process window set comprises inputting bucket observation values into the prediction equation.

Additionally, the present invention provides a method that further comprises the step of generating a yield response curve based on the optimized process window set.

Additionally, the present invention provides a method in which the step of generating a plurality of bucket indices comprises generating at least six bucket indices.

Additionally, the present invention provides a method in which the step of generating a plurality of bucket indices comprises generating bucket indices corresponding to buckets comprising process windows that overlap with the process window of at least one adjacent bucket.

Additionally, the present invention provides a system for optimizing multiple process windows, comprising:
a data collection module;
a regression module;
a computation module; and
a report module, in which the data collection module is configured to aggregate metrology data and input data, and communicate the metrology data and input data to the regression module, the regression module configured to perform a partial least squares regression, and compute at least one variable importance prediction, and a prediction equation, the regression module further configured to communicate the at least one variable importance prediction, and the prediction equation to the computation module, the computation module configured to compute one or more optimal process windows, product limited yields, and predicted product yields, the computation module further configured to communicate the optimal process windows, product limited yields, and predicted product yields to the report module, the report module configured to output at least one report Additionally, the present invention provides a system in which the report module is configured to output a report in a tabular format, the report indicating values for a target value corresponding to each optimal process window.

Additionally, the present invention provides a system in which the report module is further configured to output a report indicating values for a lower specification limit, and an upper specification limit corresponding to each optimal process window.

Additionally, the present invention provides a system in which the report module is configured to output a report in a graphical format, the report comprising a yield response curve superimposed on a bar graph representative of a distribution of observed values of a process parameter Additionally, the present invention provides a system in which the computation module is configured to generate a plurality of bucket indices, wherein each bucket index corresponds to a process window, and each process window overlaps with the process window of at least one adjacent bucket index Additionally, the present invention provides a system that further comprises a tool configuration module, wherein the tool configuration module is configured to receive process windows from the computation module, and wherein the tool configuration module is configured to communicate process windows to one or more process tools.

Additionally, the present invention provides a system in which the process tool comprises an etch tool.

Additionally, the present invention provides a system in which the process tool comprises a deposition tool.

Additionally, the present invention provides a system in which the process tool comprises a lithography tool.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

In the drawings accompanying the description that follows, often both reference numerals and legends (labels, text descriptions) may be used to identify elements. If legends are provided, they are intended merely as an aid to the reader, and should not in any way be interpreted as limiting. Note that this disclosure contains various charts and graphs that contain numbers. To aid in distinguishing reference numbers from numbers that are part of the chart legends, an "Arial" font is used for chart legends, and an italicized "Times Roman" font is used for reference numbers.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. Well-known processing steps and materials are generally not described in detail in order to avoid unnecessarily obfuscating the description of the present invention.

Figure 1:
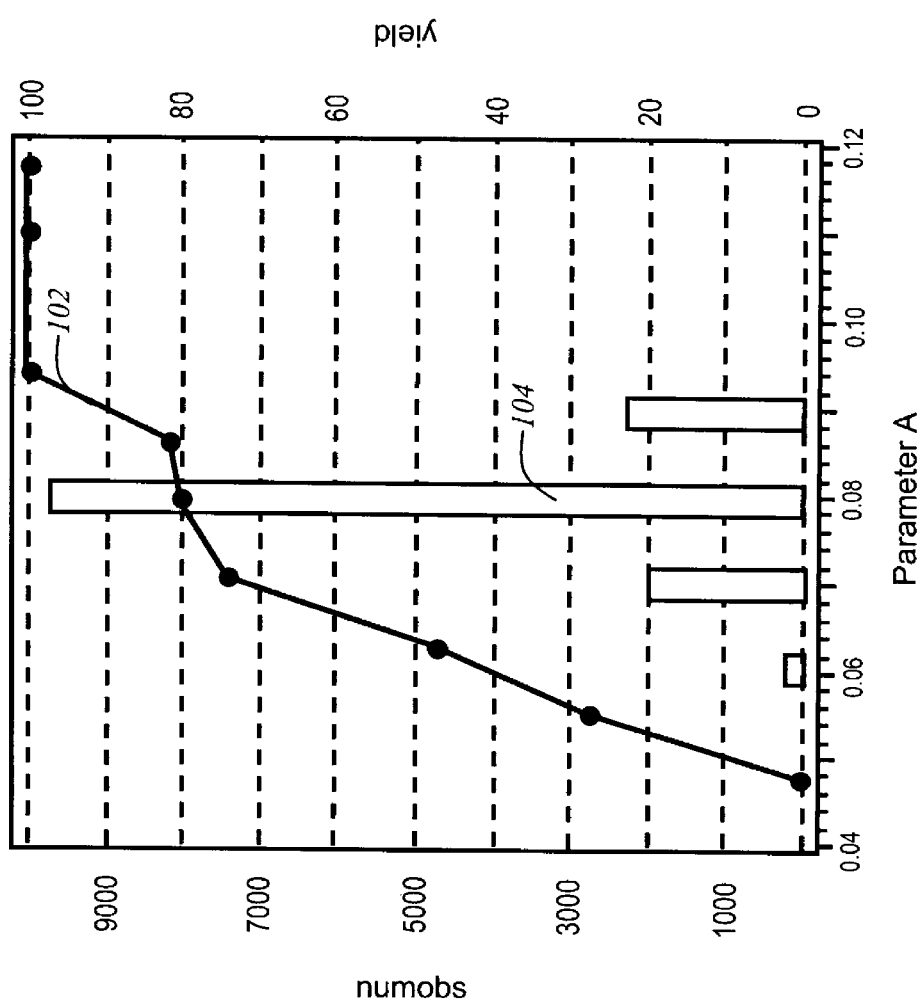
FIG. 1 is a graph showing a yield response curve for CA open defects.

FIG. 1 is a graph showing a yield response curve 102 for CA open defects. The yield response curve 102 represents the yield of semiconductor devices as a function of an arbitrary process parameter, indicated on the X axis as Parameter A. The graph of FIG. 1 is a dual-Y-axis graph. The right Y axis is labeled "yield" and represents the percent yield, due only to CA open defects (referred to as the CA open yield), as graphically indicated by yield response curve 102. The yield response curve 102 is superimposed on a bar graph comprising a plurality of bars 104.

The bars on the graph (indicated generally as 104) represent a distribution of the number of observed values of parameter A during empirical observations. Each bar 104 represents a distinct range of values for parameter A. For example, the bar at the X axis point of 0.08 represents approximately 9800 observations with parameter A in the range of 0.075-0.085. The left Y axis is labeled "numobs" to signify the "number of observations" of parameter A that fell into a particular range during a processing step of semiconductor manufacturing (such as, a metallization or etch step, for example). As indicated by response curve 102, the CA open yield increases as the value of parameter A increases.

Figure 2:
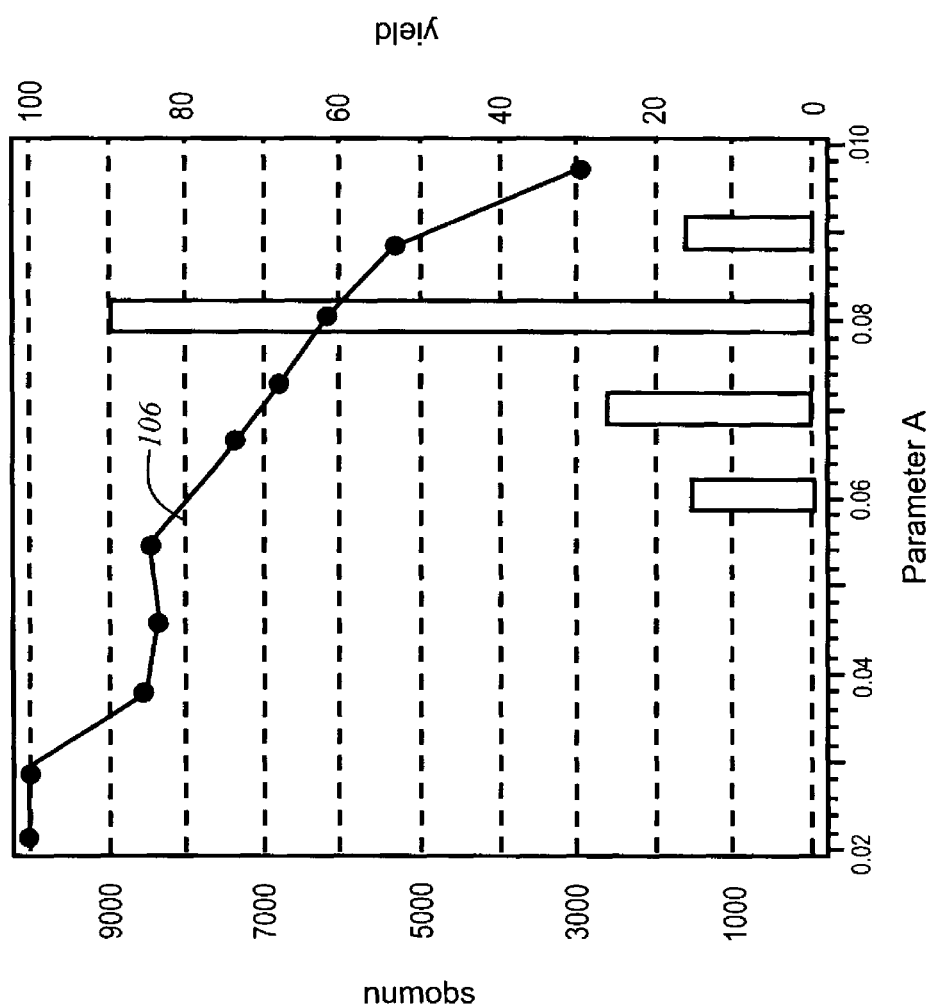
FIG. 2 is a graph showing a yield response curve for CA short defects.

FIG. 2 shows a similar chart as FIG. 1, but for the CA short yield, as a function of parameter A. In this case, the CA short yield response curve 106 indicates that the CA short yield (i.e. the yield due only to CA short defects) decreases as the value of parameter A increases. Hence, there is a tradeoff in deciding the optimal value of parameter A. If parameter A is too low, then the CA open yield will be poor, making the overall yield poor. If parameter A is too high, then the CA open yield will improve, but the CA short yield will be low, and overall yield will therefore below. Therefore it is desirable to pick the optimal value of parameter A to optimize overall yield.

However, in practice, semiconductor processes are typically subject to multiple parameters, that may have interdependence among each other. Hence, for effective process optimization, it is necessary to identify which parameters are the most significant in determining the yield of a process, and then to determine where the optimal range of values (process window) for each parameter. Furthermore, it is desirable to make this determination as early as possible in the semiconductor manufacturing process. The present invention allows this assessment to be made during an intermediate metallization process, therefore allowing optimizations to be made earlier, rather than later.

Figures 3, 7:
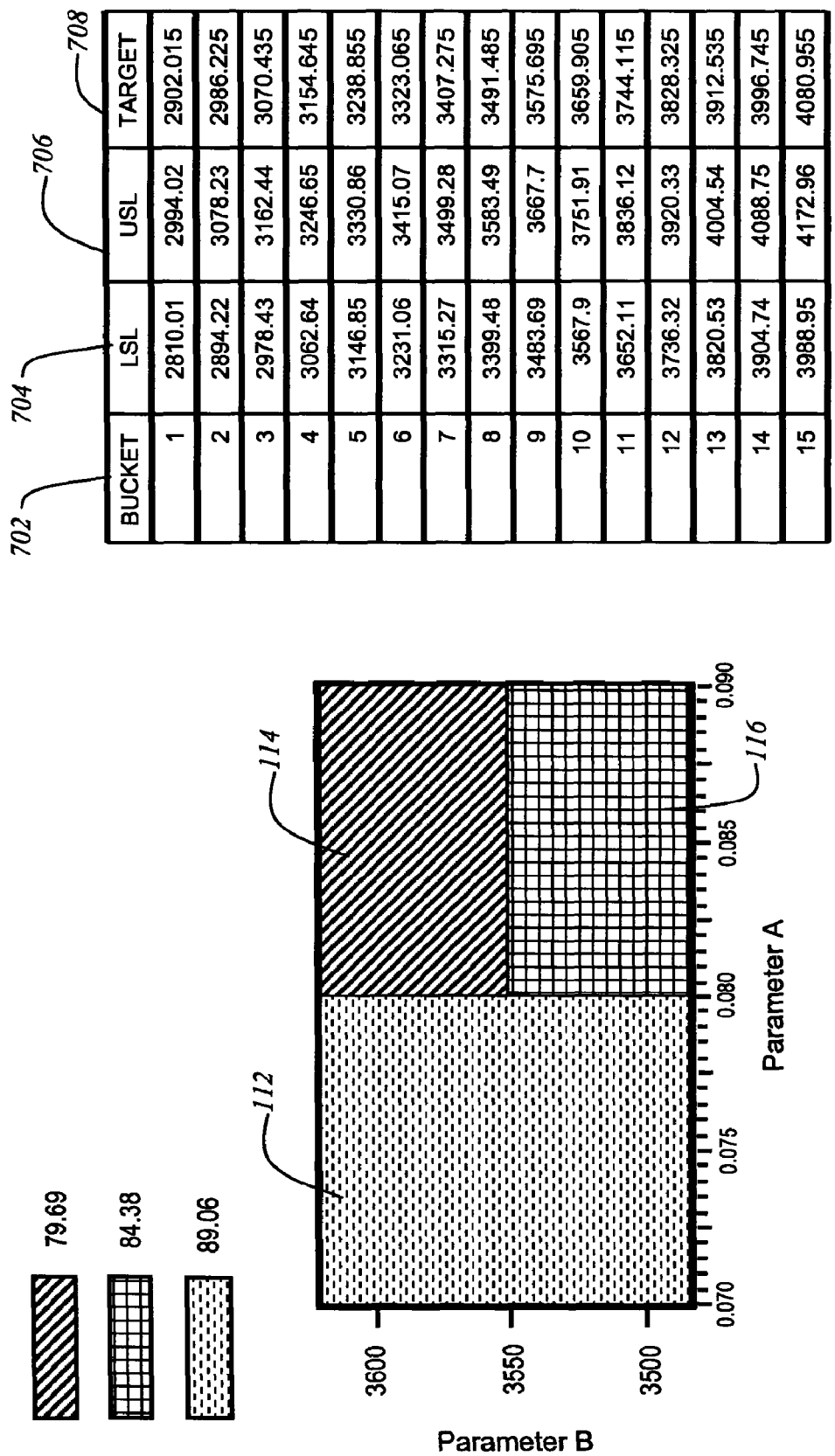
FIG. 3 is a graphical representation of the effects of interaction of process windows on product yield.
FIG. 7 is a chart showing the relationship between bucket numbers and process windows.

FIG. 3 shows a chart providing a graphical representation of interaction amongst two parameters. In this case, parameter A is on the X axis of the chart. Parameter B is on the Y axis of the chart. Three regions on the chart indicate three different overall product yield percentages. In this exemplary dataset, region 112 represents a yield of 89.06 percent, region 114 represents a yield of 79.69 percent, and region 116 represents a yield of 84.38 percent. If the value of parameter A exceeds 0.080, then the value of parameter B has an impact on product yield. As is shown in the chart, if the value of parameter A exceeds 0.080, then if the value of parameter B exceeds 3,550, the resulting product yield (represented by region 114) is 79.69 percent. Similarly, if the value of parameter B is below 3,550, then the resulting product yield (represented by region 116) is 84.38 percent.

However, if the value of parameter A is kept below 0.080, then the effect of parameter B becomes negligible on product yield. In this case (represented by region 112), product yield is 89.06 percent, and there is no need to include parameter B in the optimization process.

Figure 4:
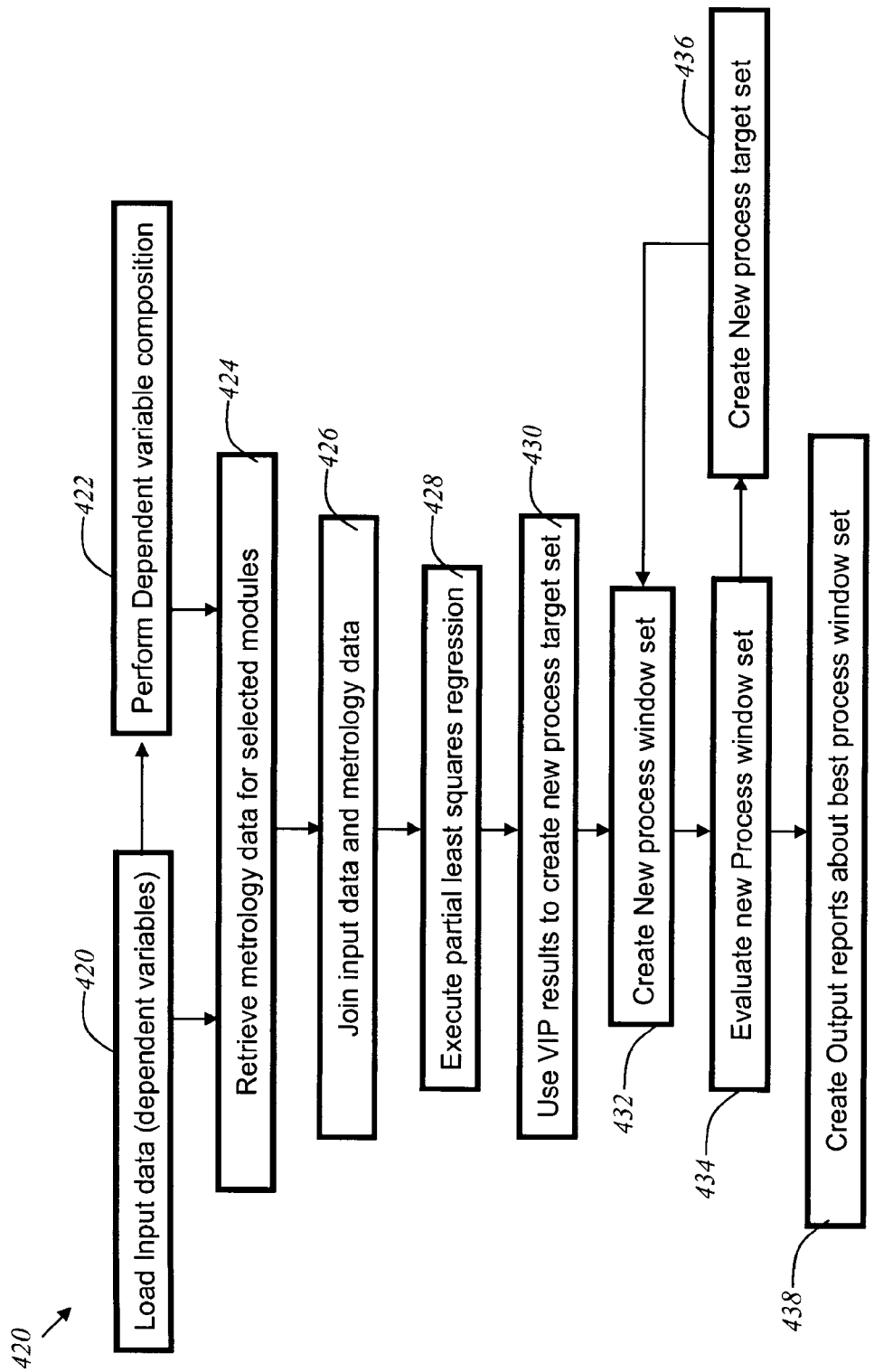
FIG. 4 is a flowchart indicating process steps to perform the method of the present invention.

FIG. 4 is a flowchart 400 indicating process steps to perform the method of the present invention. In practice, these steps are performed via software executing on a computer system. In process step 420, the various dependent variable data is loaded into the computer system, in a format able to be read by the software executing the method of the present invention, such as a database, flat file, or other structure suitable for this purpose. In step 422, dependent variable composition is performed. In this step, the product limited yield ("limited yield" is a terminology in semiconductor manufacturing referring to the yield related to one mechanism, such as CA opens) is computed as a function of the yield of the corresponding test structure. The use of such test structures are standard industry practice.

In the case of CA opens and CA shorts, the following formulas are used:

Product limited yield(*CA* open)=*f*(test structure yield of *CA* open)Product limited yield(*CA* short)=*f* (test structure yield of *CA* short)The predicted product yield(the overall yield for the product)is then performed by computing the product of all the product limited yields.

Predicted Product yield(combined *CA* short and *CA* open)=Product limited yield(*CA* open)*Product limited yield(*CA* short)

The functions to derive the product limited yields from the test structure observations can be based on the negative binomial yield model. In this case the test structure yield TSy (for CA open) is:

$TSy(CA\ Open) = 1/(1+\text{lambda}*N1/\text{alpha})^{\text{alpha}}$

Where alpha is a clustering factor (a measure of the positional correlation between separate defects) based on actual data, N1 is the number of contacts in test structure, and lambda is the fail rate of contact opens. Since all variables except lambda are known a priori, lambda can be solved by this equation.

The product limited yield PLy(CA open) is then calculated as $PLy(CA\ open) = 1/(1+\text{lambda}*N2/\text{alpha})^{\text{alpha}}$ Where N2 is the number of contacts in the product, and the lambda value is previously derived from the test structure observations. A similar approach is used to derive predicted yields for CA short defects. Note that if there is only one dependent variable to be considered (e.g. only CA open yield), then the method can proceed directly from process step 420 to step 424, without going to process step 422.

In process step 424, metrology data pertaining to the actual test run of the fabrication process are retrieved from the corresponding process tools (e.g. etch tools, lithographic tools, furnaces, for example).

In process step 426, the input data is combined with the metrology data used during the fabrication process. This process step pairs observed or composed product yield results with a corresponding set of process windows. This collection of data is referred to as a joined data set. At this point in the method, the various dependent variables (CA open yield and CA short yield) and the corresponding process windows (e.g. parameter A, and parameter B) are available for regression analysis in process step 428.

In process step 428, a partial least squares regression technique is performed on the data that is aggregated in process step 426. The partial least squares regression is a well-known mathematical technique that can be performed by a variety of commercial software packages, such as Statistics Toolbox, by MathWorks, of Natick Mass., and XLSTAT-PLS, by Kovach Computing Services, of Wales, U.K., just to name a few.

The partial least squares regression is useful for balancing the two objectives of explaining response variation and explaining predictor variation. In the present invention the partial least squares regression (PLS) is used for cross validation.

Part of this process involves selecting the number of parameters used to fit the model to only part of the available data (the training set) and to measure how well models with different numbers of extracted factors fit the other part of the data (the test set). These selected parameters are called predictors, and this technique is called test set validation.

However, for semiconductor manufacturing processes, it is not usually feasible to obtain sufficient data to make both parts large enough for pure test set validation to be useful. Therefore, the present invention employs the technique of performing several different divisions of the observed data into training sets and test sets. This is called cross validation.

As a result of the PLS regression, a Variable Importance Prediction (VIP) value is produced for each predictor, as well as a prediction equation that predicts product yield based on the values of the predictors. The VIP represents the significance of each selected process parameter (predictor) in determining the product yield. If a predictor has a relatively small coefficient (in absolute value) and a small value of VIP, then it is a prime candidate for deletion (e.g. not being considered in the optimization process).

The significance of each predictor is ranked, based on the absolute value of VIP, with a larger absolute value indicated more significance. The sign of the value of the VIP determines the direction to move the process window target in order to positively affect the process yield. If the sign of the VIP value is positive, it means that by shifting the process window of the corresponding predictor (e.g. process A) to the right, process yield will improve. If the sign is negative, shifting the process window to left will improve process yield.

The derived VIP values for each predictor (e.g. parameter A, parameter B, etc. . . . ) are used to derive a new process target set in process step 430. This involves selecting a new set of ideal values for the parameters.

From the process target set, a new process window set is generated in process step 432. In this case, each target value is used to define a range. For example, the achievable process range for parameter A may be plus or minus 0.010. Therefore, if the target value for parameter A is 0.080, then process window for parameter A is 0.070-0.090. As the parameter A target value is adjusted, the process window for parameter A is adjusted accordingly.

In process step 434, the new process window set is evaluated by using the product yield formulas described earlier and determining if the new process window set is an improvement over the previous process window set. If the new process window set improves yield, then a new process target set is created by adjusting the target values of each parameter. The adjustments are made by predetermined increments. For example, the next iteration may shift the target value for parameter A to 0.082, and then to 0.084, and so on, each time repeating the analysis. If the predicted yield is improved, then the process targets are adjusted again, in process step 436, and then process steps 432 and 434 are repeated until no further improvement in yield is predicted. At that point the optimized process window set is output to a report in process step 438.

For example, suppose a fabrication process has two process parameters, A, and B. Furthermore, suppose that parameter A has a higher VIP absolute value than parameter B. In this case, for step 432, parameter A is adjusted first, and an operating range for parameter A about the optimal value defines a first process window for parameter A. Next, parameter B is adjusted until the product yield is optimal, and a range based on that optimal value forms the first process window for parameter B. The combination of process window A and process window B comprise a first process set. The product yield for the first process set is evaluated in step 434. This evaluation is based on the product yield formulas described earlier. In step 436, the process window for parameter A is shifted, and the procedure repeats, with a new process window for parameter B being generated. This forms a second process window set. The first and second process window sets are compared. The procedure repeats until an optimal process window set is obtained.

Figure 5:
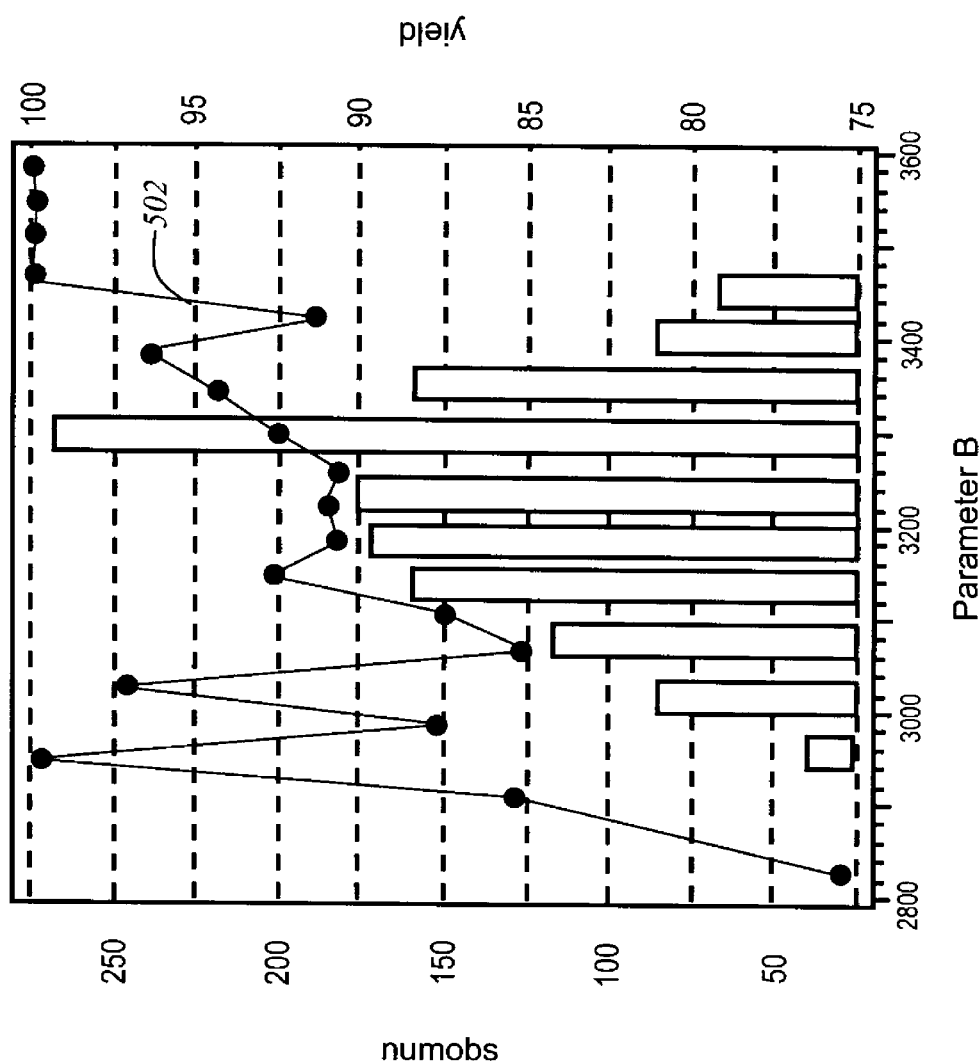
FIG. 5 is a graph showing a yield response curve for overall product yield derived using prior art methods.

FIG. 5 is a graph showing a yield response curve 502 as a function of parameter B, for overall product yield derived using prior art methods. As can be seen, yield response curve 502 has multiple peaks within the process window range. This makes it difficult to locate the optimal process yield within the achievable limits of the process window for parameter B.

Figure 6:
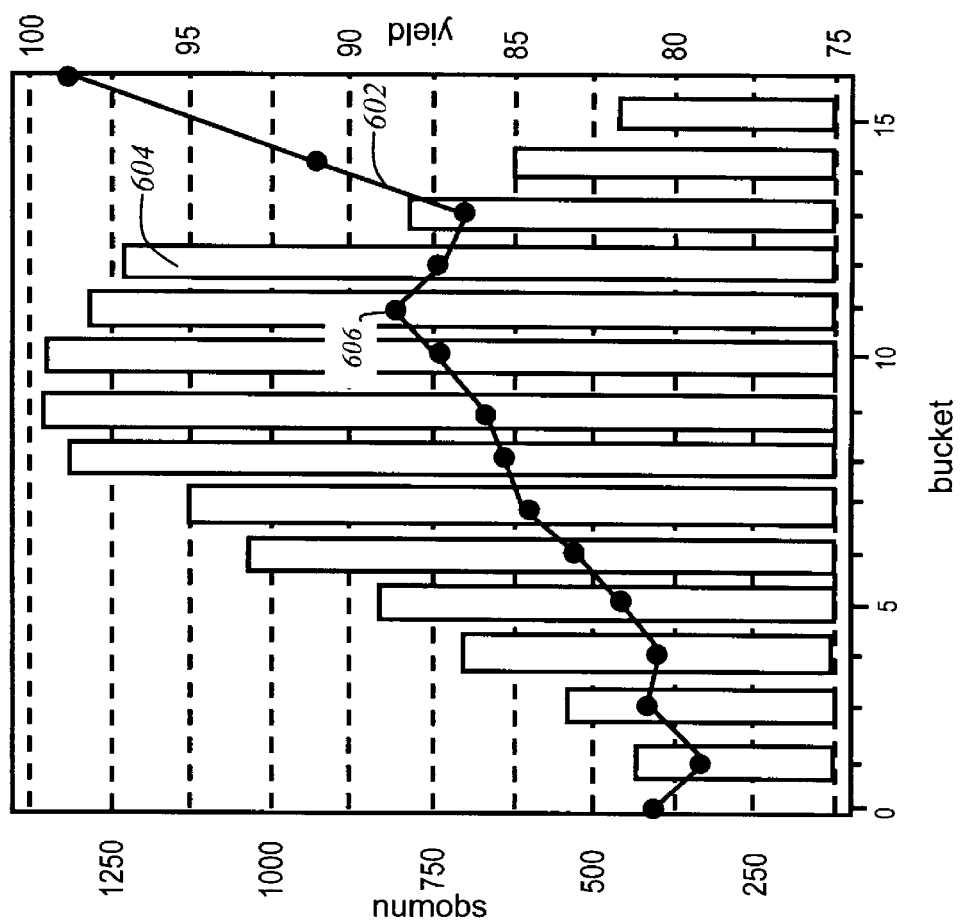
FIG. 6 is a graph showing a yield response curve for overall product yield derived using the method of the present invention.

FIG. 6 is a graph showing a yield response curve 602 for overall product yield derived using the method of the present invention. Note that the X axis in FIG. 6 is a bucket index, as compared with the X axis of FIG. 5, which is parameter B. The bucket index is a synthesized value that represents a range of values for a parameter (such as parameter B). Each bucket index can be thought of as an "index" corresponding to a particular process window. Each bucket has process windows that overlap with the process window of at least one adjacent bucket.

FIG. 7 is a chart showing the exemplary relationship between bucket numbers and process windows for the buckets show in FIG. 6. Column 702 represents the bucket number. Column 704 represents the lower specification limit (LSL). Column 706 represents the upper specification limit (USL).

Column 708 represents the target value. As can be seen, the values in each bucket overlap with an adjacent bucket. For example, bucket 2 has a LSL of 2894.22 and a USL of 3078.23. Bucket 3 has a value of 2978.43 and a USL of 3162.44. Therefore, there is an overlap between bucket 2 and bucket 3 in the range of 2978.43 and 3078.23. Any observations within that range will be counted in both bucket 2 and bucket 3.

Referring back to FIG. 6 again, the effect of using bucket values (represented by the bars, referred to generally as 604) instead of non-overlapping process window ranges (as shown in FIG. 5) is indicated by a smoother response curve 602. The response curve shows a more clearly defined peak (indicated as reference number 606) within the achievable process window.

While the present invention shows the use of generic parameters, e.g. parameter A, and parameter B. It is useful to consider some actual parameters used in performing this method for improving semiconductor yield. Parameters used may include, but are not limited to, the oxide thickness before contact lithography, the contact size after lithographic development, the contact etch bias (contact size difference before and after etch), and the contact-to-poly alignment. The contact-to-poly alignment is a measure of how precisely positioned the contacts are to polysilicon traces during fabrication. Due to machine errors, contact positions on the wafer may be shifted relative to polysilicon (also referred to as "poly"). If contact positions have a lot of variations due to poor alignment, some contacts may be shifted very close to poly and cause contact-to-poly shorts. While these are examples of some parameters that are important in various semiconductor fabrication steps, other fabrication steps may have different parameters. The present invention can be applied to many different types of process parameters, beyond those listed above for the purposes of example.

Figure 8:
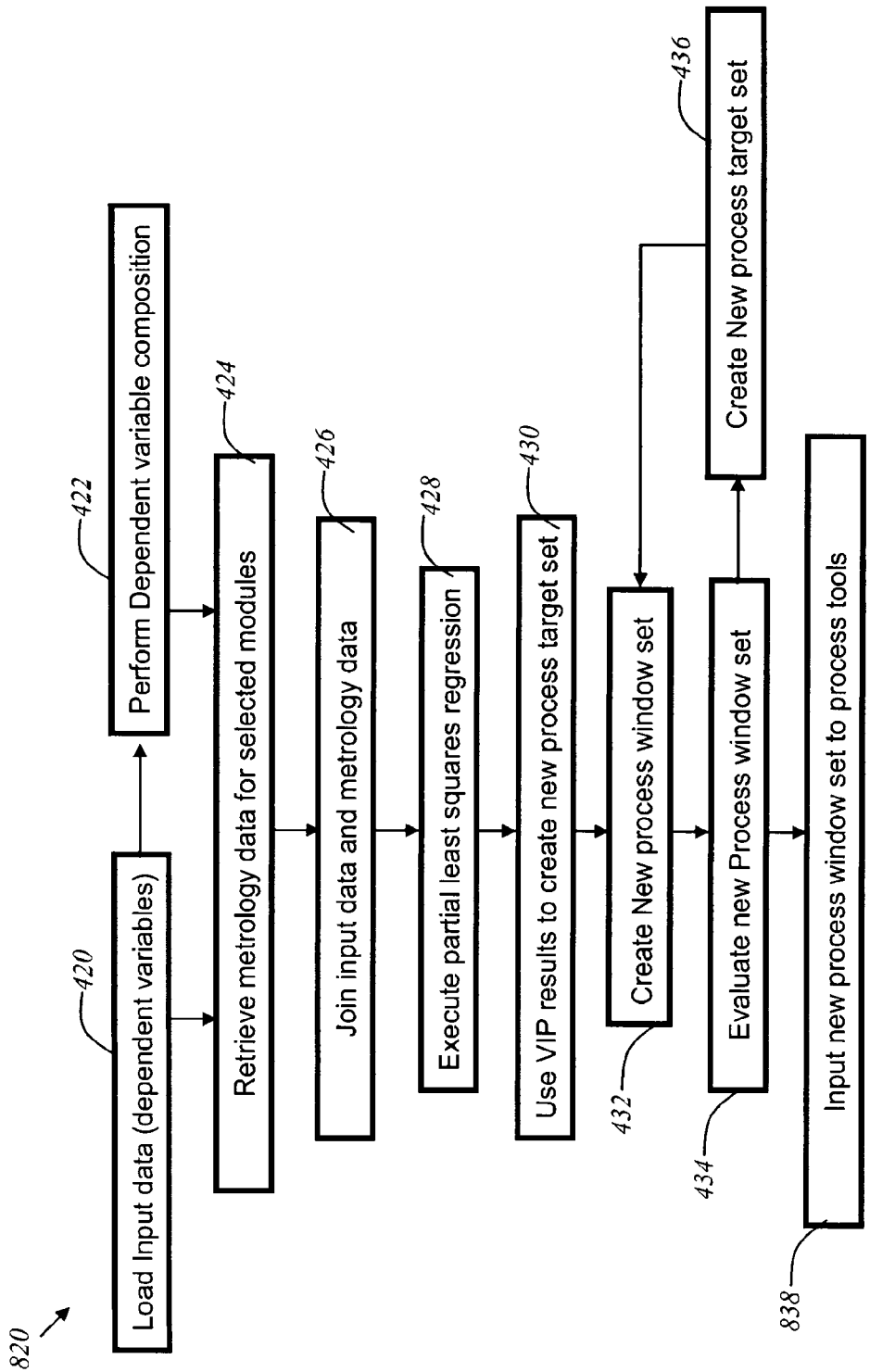
FIG. 8 is a flowchart indicating process steps to perform an alternative embodiment of the method of the present invention.

FIG. 8 is a flowchart indicating process steps to perform an alternative embodiment of the method of the present invention. In this embodiment, process steps 420-436 are identical to those described for FIG. 4. In the last process step 838, the optimized process windows are automatically input to process tools to configure the process tools to utilize the optimized process windows. In this way, the results derived from the present invention are automatically applied to a subsequent manufacturing process.

Figure 9:
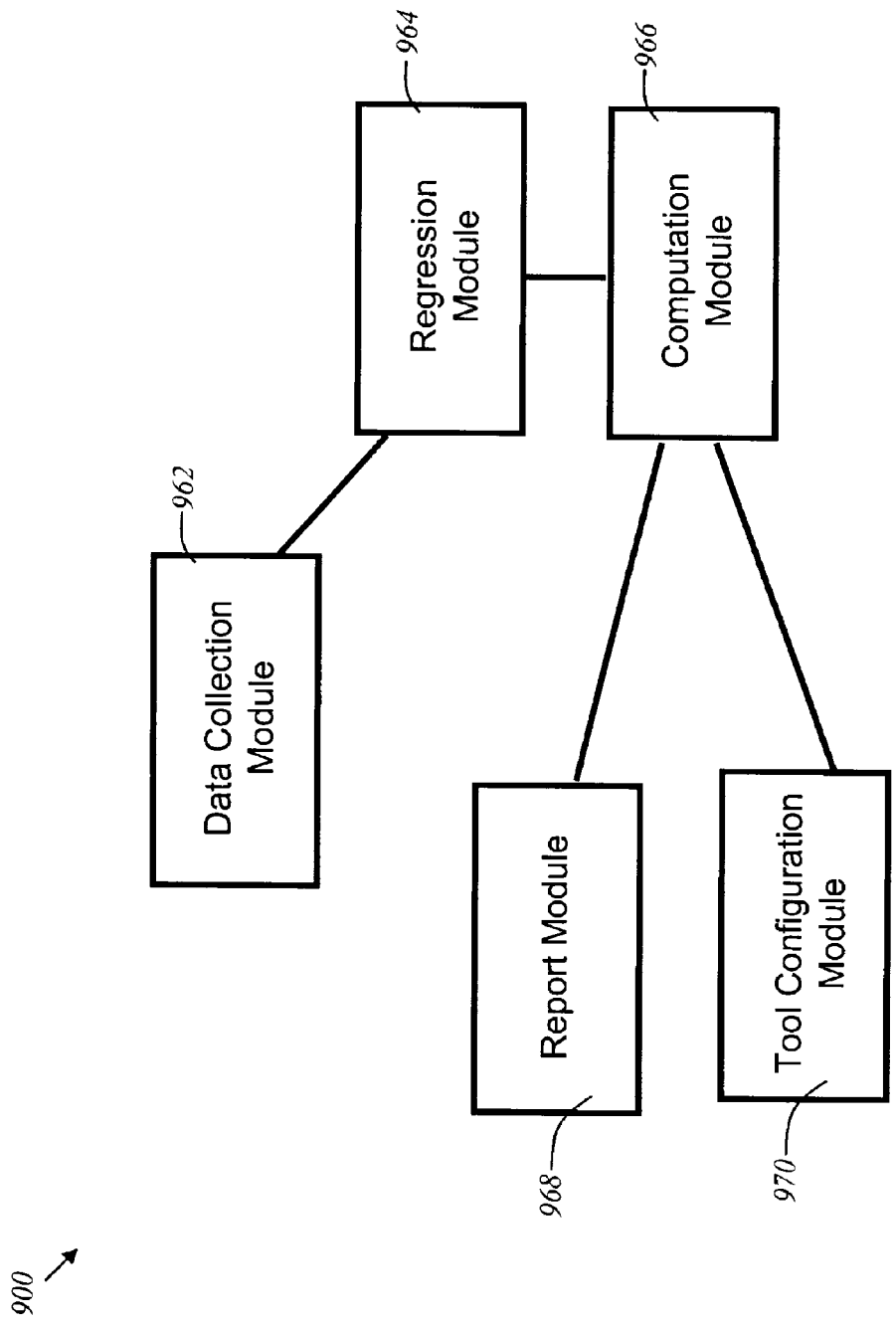
FIG. 9 shows a block diagram 900 of an exemplary system that implements the present invention.

The present invention may be implemented via software executing on one or more computers. When multiple computers are used, they may communicate with each other via a communications network. FIG. 9 shows a block diagram 900 of an exemplary system that implements the present invention. Data collection module 962 aggregates metrology data and input data (see process steps 420-426). Regression module 964 performs a Partial Least Squares regression on data supplied by data collection module 962 (see process step 428). Computation module computes optimal process windows, product limited yields, and predicted product yields based on information supplied by regression module 964 (see process steps 432-436). Report module 968 generates reports based on data supplied by computation module 966 (see process step 438). The reports may include a tabular format, similar to that shown in FIG. 7. Additionally a graphical format, such as that shown in FIG. 6 may also be generated by report module 968. Optionally, tool configuration module 970 configures one or more process tools based on data supplied by computation module 966 (see process step 838). These process tools may include, but are not limited to, an etch tool, a polishing tool, a lithography tool, and a deposition tool.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for optimizing multiple process windows, each process window corresponding to a different process parameter, in a semiconductor manufacturing process, comprising the steps of:
    performing dependent variable composition on a plurality of dependent variables;
    retrieving metrology data for each process parameter;
    joining the plurality of dependent variables and the metrology data to form a joined data set;
    performing a partial least squares regression on the joined data set to obtain a prediction equation, and a variable importance prediction for each process parameter;
    generating a process target value for each parameter, based on the value of the corresponding variable importance prediction;
    generating a new process window for each parameter, based on the corresponding process target value, thereby forming a process window set;
    evaluating the process window set by deriving a plurality of product limited yield values based on a negative binomial yield model, and comparing it to the plurality of product limited yield values derived with a previous process window set, and computing a predicted product yield value based on the product of the plurality of product limited yield values; and
    repeating the steps of generating a process target value for each parameter, based on the value of the corresponding variable importance prediction and generating a new process target window for each parameter, based on the corresponding process target value until, the predicted product yield value has reached an optimal value, thereby deriving an optimized process window set, and further comprising the steps of:
        generating a plurality of bucket indices, wherein each of the plurality of bucket indices corresponds to a bucket, and each bucket corresponds to a process window, and each process window overlaps with the process window of at least one adjacent bucket index; and
        wherein the step of evaluating the process window set by deriving a process yield value based on data corresponding to the process window set comprises inputting bucket observation values into the prediction equation.

2. The method of claim 1, further comprising the step of: generating a yield response curve based on the optimized process window set.

3. The method of claim 1, wherein the step of generating a plurality of bucket indices comprises the step of:
    generating at least six bucket indices.

4. The method of claim 1,
    further comprising the step of entering a bucket observation value into two adjacent buckets when the bucket observation value is within the process window olboth of the two adjacent buckets.

5. A system for optimizing multiple process windows, comprising:
    a data collection module;
    a regression module;
    a computation module; and
    a report module, wherein the data collection module is configured to aggregate metrology data and input data, and communicate the metrology data and input data to the regression module, the regression module is configured to perform a partial least squares regression, and compute at least one variable importance prediction, and a prediction equation;
    the regression module further configured for communicating the at least one variable importance prediction, and the prediction equation to the computation module;
    the computation module configured for computing one or more optimized process windows, product limited yields, and predicted product yields, the computation module further configured for communicating the optimized process windows, product limited yields, and predicted product yields to the report module; and
    the report module configured for outputting at least one report , and wherein:
    the computation module is configured to generate a plurality of bucket indices, wherein each of the plurality of bucket indices corresponds to a bucket, and each bucket corresponds to a process window, and each process window overlaps with the process window of at least one adjacent bucket index, and wherein the computation module is implemented via software executing on one or more computers.

6. The system of claim 5, further comprising:
    a tool configuration module, wherein the tool configuration module is configured to receive process windows from the computation module, and wherein the tool configuration module is configured to communicate process windows to one or more process tools.

7. The system of claim 6, wherein the process tool comprises an etch tool.

8. The system of claim 6, wherein the process tool comprises a deposition tool.

9. The system of claim 6, wherein the process tool comprises a lithography tool.

10. The system of claim 5, further comprising two adjacent buckets, wherein both of the two adjacent buckets contains an identical bucket observation value, the bucket observation value being within the range of both of the two adjacent buckets.

11. The method of claim 1, wherein the step of evaluating the process window set by deriving a plurality of product limited yield values based on a negative binomial yield model comprises:
    computing a lambda value based on test structure yield for contact area opens, and the number of contacts in the test structures; and
    computing a product limited yield for contact area opens as a function of the lambda value and the number of contacts in the product.

* * * * *